US007056762B2

(12) United States Patent
Moore et al.

(10) Patent No.: US 7,056,762 B2
(45) Date of Patent: Jun. 6, 2006

(54) METHODS TO FORM A MEMORY CELL WITH METAL-RICH METAL CHALCOGENIDE

(75) Inventors: John T. Moore, Boise, ID (US); Terry L. Gilton, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 10/769,787

(22) Filed: Feb. 3, 2004

(65) Prior Publication Data

US 2004/0157417 A1   Aug. 12, 2004

Related U.S. Application Data

(62) Division of application No. 10/231,779, filed on Aug. 29, 2002, now Pat. No. 6,867,114.

(51) Int. Cl.
*H01L 21/06* (2006.01)
(52) U.S. Cl. .......................... 438/95; 438/102
(58) Field of Classification Search ................ 438/95, 438/102
See application file for complete search history.

(56) References Cited

U.S. PATENT DOCUMENTS

| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |

(Continued)

FOREIGN PATENT DOCUMENTS

JP            56126916        10/1981

(Continued)

OTHER PUBLICATIONS

Abdell-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Mary Wilczewski
*Assistant Examiner*—Toniae M. Thomas
(74) *Attorney, Agent, or Firm*—Dickstein Shapiro Morin & Oshinsky LLP (57) ABSTRACT

The invention relates to the fabrication of a resistance variable material cell or programmable metallization cell. The processes described herein can form a metal-rich metal chalcogenide, such as, for example, silver-rich silver selenide. Advantageously, the processes can form the metal-rich metal chalcogenide without the use of photodoping techniques and without direct deposition of the metal. For example, the process can remove selenium from silver selenide. One embodiment of the process implants oxygen to silver selenide to form selenium oxide. The selenium oxide is then removed by annealing, which results in silver-rich silver selenide. Advantageously, the processes can dope silver into a variety of materials, including non-transparent materials, with relatively high uniformity and with relatively precise control.

9 Claims, 6 Drawing Sheets

U.S. PATENT DOCUMENTS

| | | |
|---|---|---|
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 * | 2/2002 | Moore et al. ............... 438/130 |
| 6,350,679 B1 | 2/2002 | McDaniel et al. |
| 6,376,284 B1 | 4/2002 | Gonzalez et al. |
| 6,388,324 B1 | 5/2002 | Kozicki |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowrey |

| | | |
|---|---|---|
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 6,737,312 B1 * | 5/2004 | Moore .................. 438/238 |
| 6,867,064 B1 * | 3/2005 | Campbell et al. .......... 438/95 |
| 2002/0000666 A1 | 1/2002 | Kozicki |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki et al. |
| 2002/0168852 A1 | 11/2002 | Harshfield et al. |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155605 A1 | 8/2003 | Campbell et al. |
| 2003/0156447 A1 | 8/2003 | Kozicki |
| 2003/0156463 A1 | 8/2003 | Casper et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | 97/48032 | 12/1997 |
| WO | 99/28914 | 6/1999 |
| WO | 00/48196 | 8/2000 |
| WO | 02/21542 A1 | 3/2002 |
| WO | 02/082452 A2 | 10/2002 |

OTHER PUBLICATIONS

Adler, D.: Moss, S.C., Amorphous memories and bistable switches, J. Vac. Sci. Technol. 9 (1972) 1182-1189.

Adler, D.: Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi, M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Axon Technologies Corporation, Technology Description: *Programmable Metalization Cell(PMC)*, pp. 1-6 (Pre-May 2000).

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.;Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S-to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defeat Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips; J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17$^{th}$ (1985) 833-36.

Bressser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalvern, R.; Gill, R. Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A; Vautier, C., Role of photoinduced defects in amorphous GexSe1-x photoconductivity, J. Non-Cryst. Solids 155 (193) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: a unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer, Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of a amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg; elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title p. 114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett, No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x (O<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts. N.; Andreichin, R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTI chalcognide semiconductor films, Thin Solid Films 240 (1994) 143-146.

Kozicki et al., Silver Incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Koziki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in $GexSe1-x$ glass, Appl. Phys. Lett. 46 (1985) 543-545.

Matsushita, T.; Yamagami, T.; Okuda, M., Polarized memory effect observed on $Se-SnO2$ system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in $TeO2-V2O5$ based glasses, Journal de Physique IV 2 (1992) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation In Ge-Se glasses used in programmable metallization cell devices, J. Non-Cryst. Solids 299-302 (2002) 1023-1027.

Miyatani, S-y., Electronic and ionic conduction in $(AgxCu1-x)2Se$, J. Phys. Soc. Japan 34 (1973) 423-432.

Miyatani, S.-y., Electrical properties of $Ag2Se$, J. Phys. Soc. Japan 13 (1958) 317.

Miyatani, S.-y., Ionic conduction in beta-$Ag2Te$ and beta-$Ag2Se$, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of $GexSe1-x$ amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52. (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K. ;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A. G.;Owen,A.E., Aspects of non-volatility in a-Si:H memory devices, Mat. Res. Soc. Symp. Proc. V 258, 1992, 1075-1080.

Schuocker, D.; Rieder, G., On the reliability of amorphous chalcogenide switching deivces, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.; Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H. ;Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouel, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov, S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0. 40↑Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

\* cited by examiner

METHODS TO FORM A MEMORY CELL WITH METAL-RICH METAL CHALCOGENIDE

This application is a divisional of application Ser. No. 10/231,779 filed Aug. 29, 2002 now U.S. Pat. No. 6,867,114, which is incorporated herein by reference.

BACKGROUND OF THE INVENTION

1. Field of the Invention

The invention generally relates to memory technology. In particular, the invention relates to memory devices with a metal-rich metal chalcogenide, such as silver-rich silver selenide.

2. Description of the Related Art

Computers and other digital systems use memory to store programs and data. A common form of memory is random access memory (RAM). Many memory devices, such as dynamic random access memory (DRAM) devices and static random access memory (SRAM) devices are volatile memories. A volatile memory loses its data when power is removed. In addition, certain volatile memories such as DRAM devices require periodic refresh cycles to retain their data even when power is continuously supplied.

In contrast to the potential loss of data encountered in volatile memory devices, nonvolatile memory devices retain data when power is removed. Examples of nonvolatile memory devices include read only memory (ROM), programmable read only memory (PROM), erasable programmable read only memory (EPROM), electrically erasable programmable read only memory (EEPROM), Flash ROM, and the like.

One type of memory device is known as a programmable conductor memory cell or a programmable metallization cell (PMC). See U.S. Pat. Nos. 5,761,115; 5,896,312; 5,914,893; and 6,084,796 to Kozicki, et al., entitled "Programmable metallization cell structure and method of making same," the disclosures of which are hereby incorporated by reference in their entirety herein. Also see PCT publications WO 00/48196 and WO 02/21542 for additional information. Another term used to describe this cell is a resistance variable material cell. These memory cells can be nonvolatile. A programmable conductor random access memory (PCRAM) includes an array of programmable metallization cells or resistance variable material cells. Additional applications for a programmable metallization cell include use as a programmable resistance and a programmable capacitance.

Information can be stored in a resistance variable material cell by forming or by disrupting conductive pathways, which varies the resistance of the cell. In response to an applied electric field, which can be generated by an electric potential applied between electrodes, a conductive pathway grows from an electrode configured as the cathode, i.e., the electrode with the more negative electric potential, to an electrode configured as the anode, i.e., the electrode with the more positive electric potential. Information can be read or retrieved from the cell by sensing the resistance of the cell.

Conventional processes include techniques that diffuse silver (Ag) through a silver-permeable material, such as a chalcogenide glass. One example of a chalcogenide glass is germanium selenide ($Ge_xSe_{1-x}$). For example, one conventional process for producing a PMC applies silver (Ag) photodoping to a chalcogenide glass, such as germanium selenide, e.g., $Ge_3Se_7$. It is relatively difficult to diffuse silver uniformly across a wafer using conventional techniques. For example, in one conventional process, the doping of the silver varies across the wafer by about 5 to 10%, which can reduce production yield.

Silver-rich silver selenide is relatively difficult to produce using direct deposition techniques. For example, when silver (Ag) is directly deposited on silver selenide ($Ag_{2-\delta}Se$), where $0 \leq \delta \leq 1$, in an attempt to create silver-rich silver selenide ($Ag_{2+x}Se$), the silver (Ag) may agglomerate on the silver selenide and create a rough surface. Similar results may occur when attempting to deposit silver selenide ($Ag_2Se$) directly on silver (Ag).

What is needed is a process to enrich a material, including non-transparent materials, with a metal, such as silver (Ag), to fabricate materials such as silver-rich silver selenide ($Ag_{2+x}Se$) or silver-rich silver telluride ($Ag_{2+x}Te$). Such materials can be useful in cell bodies of memory devices.

SUMMARY OF THE INVENTION

The invention relates to the fabrication of a resistance variable material cell or programmable metallization cell (PMC). Advantageously, the processes described herein can form a layer of a metal-rich metal chalcogenide, such as silver-rich silver selenide ($Ag_{2+x}Se$), without the use of photodoping techniques and without direct deposition of the metal. Further advantageously, the processes can dope a metal, such as silver, into materials that are not transparent. In addition, the processes can form materials such as silver-rich silver selenide ($Ag_{2+x}Se$) with relatively high uniformity and with relatively precise control.

One process according to an embodiment of the invention forms silver-rich silver selenide ($Ag_{2+x}Se$) for a cell body for a resistance variable material cell. The process includes forming a layer of silver selenide, implanting oxygen to form selenium oxide, and annealing to remove the selenium oxide, thereby forming the silver-rich silver selenide ($Ag_{2+x}Se$). In one embodiment, regions of a wafer are selectively enriched with silver by patterning the oxygen implantation. One embodiment of the process repeatedly performs implanting of oxygen and annealing to increase an amount of silver in the silver-rich silver selenide.

BRIEF DESCRIPTION OF THE DRAWINGS

These and other features of the invention will now be described with reference to the drawings summarized below. These drawings (not to scale) and the associated description are provided to illustrate preferred embodiments of the invention and are not intended to limit the scope of the invention.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. For example, while illustrated in the context of particular materials, the skilled artisan will appreciate that the methods described herein are applicable to doping a variety of materials with tailored amounts of metal, for a variety of applications. Accordingly, the scope of the invention is defined only by reference to the appended claims.

One process according to an embodiment of the invention can form silver-rich silver chalcogenide for use in a resistance variable material cell. The silver-rich silver chalcogenide cells include at least one layer of a silver-rich silver chalcogenide and at least one layer of a chalcogenide glass, such as germanium selenide ($Ge_xSe_{1-x}$). The process can be automated such that it is under computer control. Advantageously, the process is capable of increasing the silver content of materials in a relatively uniform and well-controlled manner. For example, the process can form silver-rich silver selenide ($Ag_{2+x}Se$), silver-rich silver telluride, and the like. The silver-rich regions can be formed in a pattern across a wafer. Cells in an array of cells can be patterned to remove non-enriched regions.

These silver-rich silver chalcogenide cells can be used to store memory states, programmed resistances, and the like. When an electric potential is applied between the first electrode and the second electrode, a conductive pathway is formed or is disrupted (depending upon the polarity of the potential) in a layer of silver-permeable material, such as germanium selenide ($Ge_xSe_{1-x}$), thereby varying the resistance of the cell. The formation of the conductive pathway lowers the resistance between the electrodes. The conductive pathway can persist after the removal of the applied electric potential. This property can permit some embodiments of a resistance variable material cell to retain information in a nonvolatile manner.

While the silver chalcogenide is illustrated primarily in the context of silver selenide, the skilled artisan will appreciate that the principles and advantages described herein are applicable to other silver chalcogenides. For example, other applicable silver chalcogenides can also include silver sulfide and silver telluride.

Figure 1:
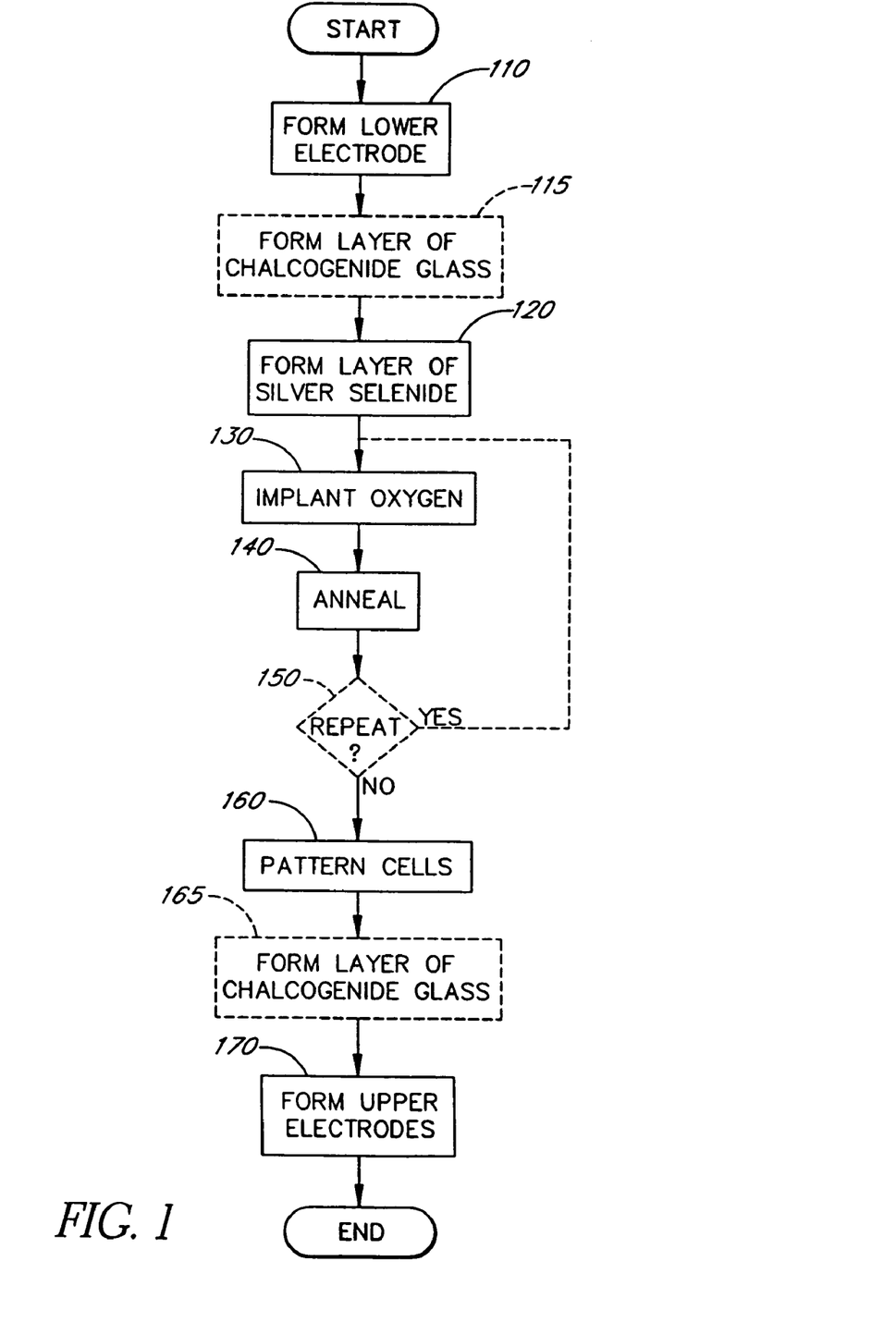
FIG. 1 is a flowchart, generally illustrating a process for forming silver-rich silver selenide ($Ag_{2+x}Se$).

FIG. 1 is a flowchart, generally illustrating a process for forming silver-rich silver selenide ($Ag_{2+x}Se$) for use in a cell body of a resistance variable material cell. Silver-rich silver selenide ($Ag_{2+x}Se$) includes more silver than stoichiometric silver selenide ($Ag_2Se$). In the illustrated process, the process advantageously forms the silver-rich silver selenide ($Ag_{2+x}Se$) without direct deposition of silver (Ag) and without photodoping. Advantageously, a resistance variable material cell can be formed on a variety of substrates and not just semiconductor substrates. For example, a resistance variable material cell can be formed on a plastic substrate. However, the substrate assembly can correspond to a semiconductor, such as a silicon wafer, to facilitate the integration of the cell with electronic devices, such as switches or transistors. The substrate should be electrically insulating or covered with a layer of insulating material to allow a difference in electric potential to be applied between electrodes of a variable resistance material cell.

The process forms 110 a lower electrode on the substrate assembly. The process can form 110 the lower electrode by forming a conductive film, which can be formed from a variety of materials, such as tungsten (W), tungsten nitride (WN), polysilicon, and others. It will be understood by one of ordinary skill in the art that the lower electrode can also include a barrier layer.

The process can proceed to form 115 a layer of chalcogenide glass, such as germanium selenide ($Ge_xSe_{1-x}$), on the lower electrode. The process can include forming the layer of chalcogenide glass below a layer of silver selenide, above the layer of silver selenide, or both. It will thus be understood that in some embodiments of the process, the forming 115 of the layer of chalcogenide glass on the lower electrode is optional. Where the layer of chalcogenide glass is formed 115 on the lower electrode, the layer of chalcogenide glass is preferably between about 50 angstroms (Å) to about 1000 (Å) thick. In one embodiment, the layer of chalcogenide glass is about 150 Å thick. An exemplary chalcogenide glass is $Ge_{0.4}Se_{0.6}$.

The process proceeds to form 120 the layer of silver selenide. It will be understood that the layer of silver selenide can be formed on the lower electrode when the process does not form a layer of chalcogenide glass below the layer of silver selenide. When the process forms the layer of chalcogenide glass on the lower electrode, the layer of silver selenide can be formed on the layer of chalcogenide glass. Although the layer of silver selenide can be formed with stoichiometric silver selenide ($Ag_2Se$), it will be understood that the silver selenide can also initially be slightly silver-rich or silver-poor, depending on the deposition process. A variety of techniques can be used to form the layer of silver selenide. Preferably, physical vapor deposition (PVD) techniques, such as evaporative deposition and sputtering, are used to form 120 the layer of silver selenide. In addition, the process can form 120 the layer of silver selenide as a single layer or in multiple layers. Although a variety of techniques are available for forming silver selenide, precise control over the composition is difficult with conventional techniques.

The process proceeds to implant 130 oxygen. Implanting of oxygen converts at least some of the silver selenide to silver-rich silver selenide ($Ag_{2+x}Se$) and to selenium oxide ($SeO_2$). A simplified chemical equation (not balanced) is provided in Equation 1.

$$Ag_2Se + O_2 \rightarrow Ag_{2+x}Se + SeO_2 \qquad \text{(Eq. 1)}$$

Ion implantation techniques are preferably used to implant the oxygen into the layer of silver selenide. Advantageously, ion implantation is a relatively well-controlled process, which correspondingly permits the amount of silver richness, x, in the silver-rich silver selenide ($Ag_{2+x}Se$) to be relatively well controlled. For example, ion implantation techniques can implant oxygen with less than 1% variation across a layer of silver selenide on the surface of a wafer. By contrast, a variation in uniformity of around 5 to 10 percent across the surface of a wafer can be expected from techniques that directly deposit silver or photodope silver.

Preferably, oxygen is implanted at a relatively high dosage. The high dosage permits the amount of silver richness, x, to be correspondingly high. Preferably, x is in a range of about 0 to about 10%. More preferably, x is in a range of about 1% to about 3%. Preferably, the oxygen is implanted to a relatively shallow depth that is relatively close to the surface. In one embodiment, the oxygen implanter tool is configured to implant oxygen to a depth or range of about 100 (Å) with a setting of about 1 to about 3 kilo-electron volts (keV). In addition, implanting 130 of oxygen and annealing 140 of the substrate assembly can be repeated as described later in connection with an optional decision block 150.

Implanting 130 of oxygen can be selectively applied to the layer of silver selenide. A pattern mask, such as a mask of photoresist, can be formed over the layer of silver selenide to allow the ion implantation to implant oxygen to selected areas. The presence of the pattern mask blocks implantation of oxygen from selected areas. The pattern mask includes open windows that permit implantation of oxygen in other areas. In another embodiment, implanting 130 of oxygen is applied to the layer of silver selenide without patterning.

The process proceeds to anneal 140 the substrate assembly. Annealing 140 removes the selenium oxide from the layer. Where implanting of oxygen has been carried out in a patterned manner, regions of silver selenide ($Ag_2Se$) and silver-rich/silver selenide ($Ag_{2+x}Se$) are left after annealing. Prior to annealing 140 the substrate assembly, the pattern mask, if present, should be removed.

Annealing 140 includes heating the substrate assembly in a chamber, which is maintained at a relatively low pressure. In one embodiment, the substrate assembly is heated such that a vapor pressure of selenium oxide (or more generally, the oxide of the element to be removed) is greater than the pressure maintained in an annealing chamber. Annealing 140 can be performed at a broad range of pressures and temperatures. Annealing 140 can be performed for a predetermined time using data collected from experimental results. Endpoint detection techniques, such as optical emission spectroscopy techniques, can also be used to determine when to stop annealing. In one embodiment, annealing 140 is performed at a temperature between about 50 degrees centigrade (C) to about 130 degrees C. for a time period of about 30 minutes to about 3 hours. Preferably, annealing is performed at a temperature of about 90 degrees C.

The process proceeds to an optional decision block 150, where the process determines whether to repeat implanting 130 and annealing 140. Implanting 130 and annealing 140 can be repeated multiple times to increase the amount of silver richness, i.e., the value of x, in silver-rich silver selenide ($Ag_{2+x}Se$). The number of times that implanting 130 and annealing 140 is repeated can be predetermined. A counter, which can be implemented in a computer memory, can track the number of iterations of implanting 130 and annealing 140. If implanting 130 and annealing 140 are to be repeated, the process returns from the optional decision block 150 to implanting 130. Otherwise, the process proceeds to pattern 160 cells. When implanting 130 is repeated, the process can implant to the same depth or to different depths.

The process can pattern 160 cells in accordance with a variety of techniques. Patterning techniques that can be used include reactive ion etch (RIE) and ion beam etching (IBE) techniques. In one embodiment, a potassium iodide/iodide ($KI/I_2$) solution is used with a pattern mask to selectively etch and thereby pattern cells. It will be understood by one of ordinary skill in the art that patterning 160 of cells may require additional steps, such as mask patterning and etching in conjunction with the mask.

The process can then form 165 a layer of chalcogenide glass on the patterned layer of silver selenide. As described earlier, the process can form the layer of chalcogenide glass below the layer of silver selenide, above the layer of silver selenide, or both. Thus, it will be understood that in some embodiments of the process, the process does not form the layer of chalcogenide glass on the layer of silver selenide.

The process then forms 170 an upper electrode. The upper electrode can be formed from a variety of materials, such as silver (Ag), titanium (Ti), tungsten (W), tungsten nitride (WN), and the like. When the process forms 165 the layer of chalcogenide glass on the patterned layer of silver selenide, the process can form 170 the upper electrode on the layer of chalcogenide glass. When the process does not form 165 the layer of chalcogenide glass, the process can form 170 the upper electrode on the patterned layer of silver selenide. It will be understood by one of ordinary skill in the art that the upper electrode can also include barrier layers preferably formed from the same metal that dopes the film.

In another embodiment of the process, the process optionally forms a layer of insulating material between the lower electrode and the upper electrode. One embodiment of a resistance variable material cell or PCRAM cell with such an insulating layer is described in greater detail later in connection with FIG. 2B. The insulating layer can be formed on the lower electrode, or the insulating layer can be formed between the silver-rich silver selenide ($Ag_{2+x}Se$) layer and the upper electrode. Advantageously, the insulating layer can prevent the unintended shorting of the lower and upper electrodes. The insulating layer can be formed from a variety of dielectrics including, for example, silicon nitride ($Si_3N_4$). The insulating layer includes vias, which can be filled with plugs of conductive material to provide electrical continuity between the lower electrode and the silver-rich silver selenide ($Ag_{2+x}Se$) layer or between the upper electrode and the silver-rich silver selenide ($Ag_{2+x}Se$) layer. An example of a suitable material for such a plug is tungsten (W).

Figure 2A:
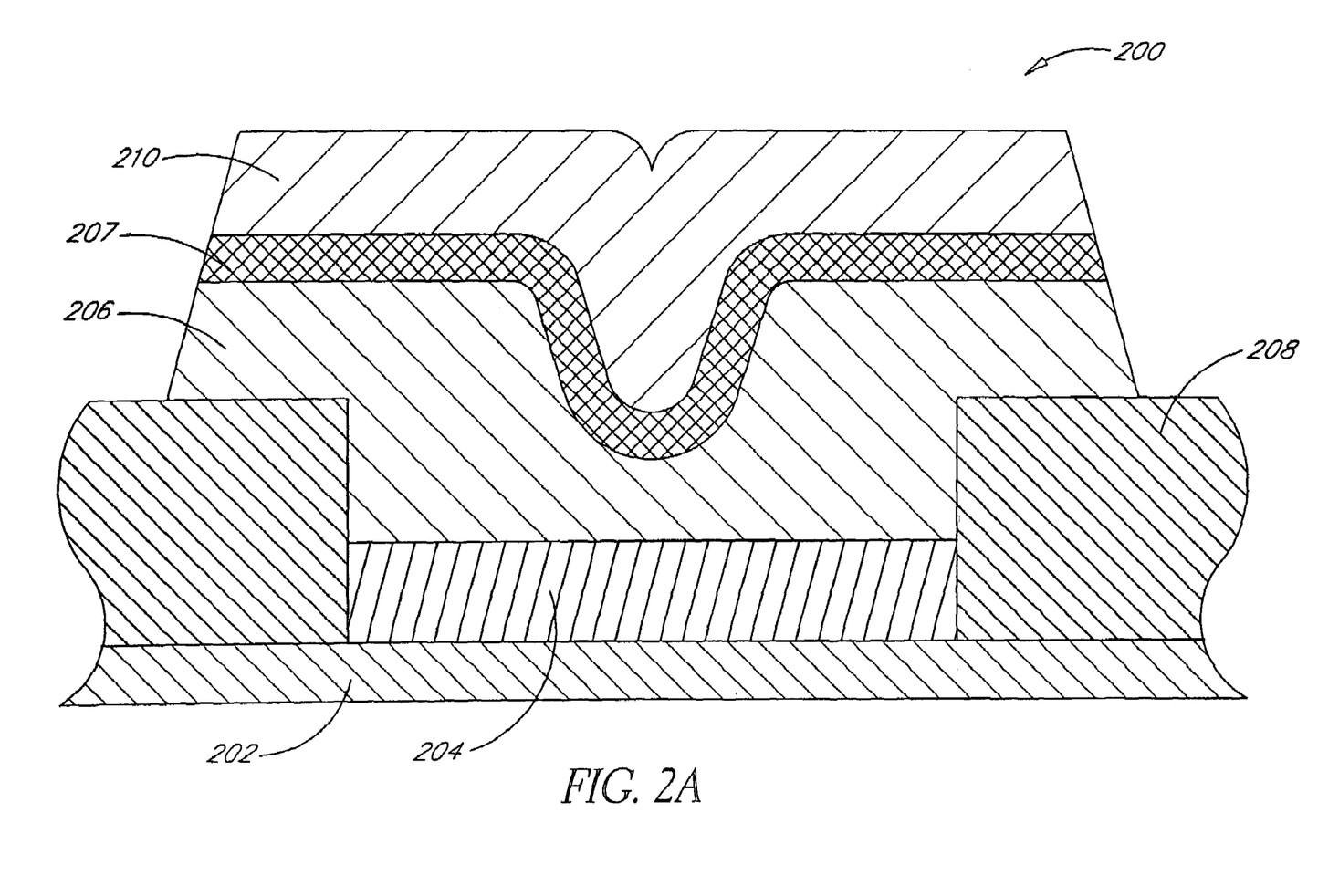
FIG. 2A is a cross-sectional view illustrating a resistance variable material cell according to one embodiment of the invention.

FIG. 2A is a cross-sectional view illustrating a resistance variable material cell 200 according to one embodiment of the invention. The resistance variable material cell 200 can be fabricated on top of a variety of structures including semiconductors and insulators. The resistance variable material cell 200 includes a lower electrode 202. The lower electrode 202 can be formed from a variety of materials, such as tungsten (W), tungsten nitride (WN), and polysilicon.

A layer of silver-rich silver selenide ($Ag_{2+x}Se$) 206 forms an active layer of a body of the resistance variable material cell 200. The layer of silver-rich silver selenide ($Ag_{2+x}Se$) 206 is disposed between the lower electrode 202 and an upper electrode 210. The illustrated resistance variable material cell 200 also includes a layer of chalcogenide glass, which can be disposed on either side of the layer of silver-rich silver selenide ($Ag_{2+x}Se$) 206. For example, the layer of chalcogenide glass can be disposed between the layer of silver-rich silver selenide ($Ag_{2+x}Se$) 206 and the lower electrode 202 as shown by a lower layer of chalcogenide glass 204. The layer of chalcogenide glass can alternatively be disposed between layer of silver-rich silver selenide ($Ag_{2+x}Se$) 206 and the upper electrode 210 as shown by an upper layer of chalcogenide glass 207. It will be understood that the chalcogenide glass can correspond to a variety of chalcogenide glasses and can include, for example, germanium selenide ($Ge_xSe_{1-x}$). Preferably, the layer of silver rich silver selenide ($Ag_{2+x}Se$) 206 is between about 100 Å and about 1000 Å thick. More preferably, the layer of silver rich silver selenide ($Ag_{2+x}Se$) 206 is between about 300 Å and about 470 Å thick. The upper electrode 210 can be formed from a variety of materials, such as silver (Ag), titanium (Ti), tungsten (W), tungsten nitride (WN), and the like.

In response to a difference in electric potential applied between the lower electrode and the upper electrode, a conductive pathway is formed or is disrupted in the resistance variable material cell 200. The conductive pathway (or lack thereof) can persist after the removal of the applied electric potential. This property can permit a resistance variable material cell to retain information in a nonvolatile manner.

An insulator 208 insulates the body of the resistance variable material cell 200 from other memory cells and also prevents the undesired diffusion of active material. The insulator 208 can be formed from a variety of materials such as silicon nitride ($Si_3N_4$). Of course, the insulator 208 can be formed in multiple steps and can include multiple structures.

Figure 2B:
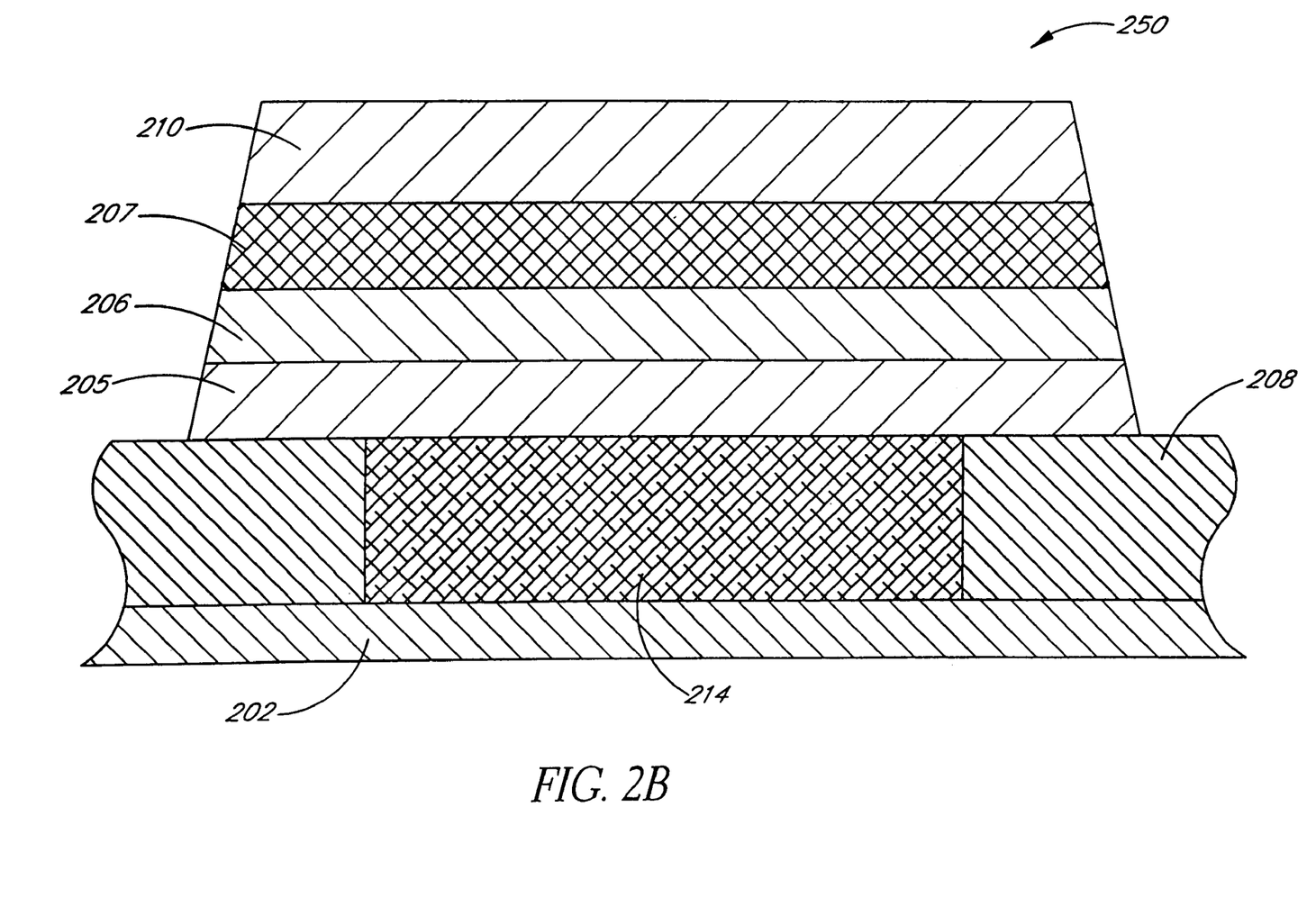
FIG. 2B is a cross-sectional view illustrating a resistance variable material cell with a conductive plug according to one embodiment of the invention.

FIG. 2B is a cross-sectional view illustrating a resistance variable material cell 250 with a conductive plug according to one embodiment of the invention. The illustrated resistance variable material cell 250 includes a plug 214 of conductive material, such as tungsten (W) formed in an opening or via defined in the insulator 208. The plug 214 is disposed between the lower electrode 202 and the upper electrode 210. Advantageously, the addition of the plug 214 can help to prevent the inadvertent or unintended shorting of the lower electrode 202 and the upper electrode 210.

In the illustrated embodiment of the resistance variable material cell 250, a lower layer of chalcogenide glass 205 is disposed between the plug 214 and the layer of silver-rich silver selenide ($Ag_{2+x}Se$) 206, and an upper layer of chalcogenide glass 207 is disposed between the layer of silver-rich silver selenide ($Ag_{2+x}Se$) 206 and the upper electrode 210. It will be understood that the resistance variable material cell 250 can include those embodiments with only one of the lower layer of chalcogenide glass 205 or the upper layer of chalcogenide glass 207, or embodiments with both as illustrated in FIG. 2B.

In the illustrated embodiment of the resistance variable material cell 250, the plug 214 is disposed between the layer of silver-rich silver selenide ($Ag_{2+x}Se$) 206 and the lower electrode 202. It will be understood by the skilled practitioner that the relative location of the plug 214 and the layer of silver-rich silver selenide ($Ag_{2+x}Se$) 206 can be interchanged, such that the plug 214 can be disposed between the layer of silver-rich silver selenide ($Ag_{2+x}Se$) 206 and the upper electrode 210. It will also be understood that a layer of silver-permeable material, such as a layer of germanium selenide, can also be disposed between the layer of silver-rich silver selenide ($Ag_{2+x}Se$) 206 and the lower electrode 202 or the upper electrode 210.

The plug 214 should be formed from a conductive material, such as tungsten (W). The illustrated plug 214 provides electrical continuity between the lower electrode 202 and the layer of silver-rich silver selenide ($Ag_{2+x}Se$) 206 or between the lower electrode 202 and the lower layer of chalcogenide glass 205, where present. Preferably, the plug 214 is formed such that the plug 214 is relatively level with the insulator 208 in which an opening or via for the plug 214 is formed.

The cells of resistance variable materials are preferably arranged in an array of cells. The array advantageously permits a relatively large number of cells, and thereby a relatively large memory space, to be fabricated contemporaneously. FIGS. 3A–E are cross-sectional views illustrating an array of resistance variable material cells in various stages of construction. It will be understood by one of ordinary skill in the art that the number of cells in an array can vary in a very broad range. In FIGS. 3A–E, three cells are shown for the purposes of illustration.

Figure 3A:
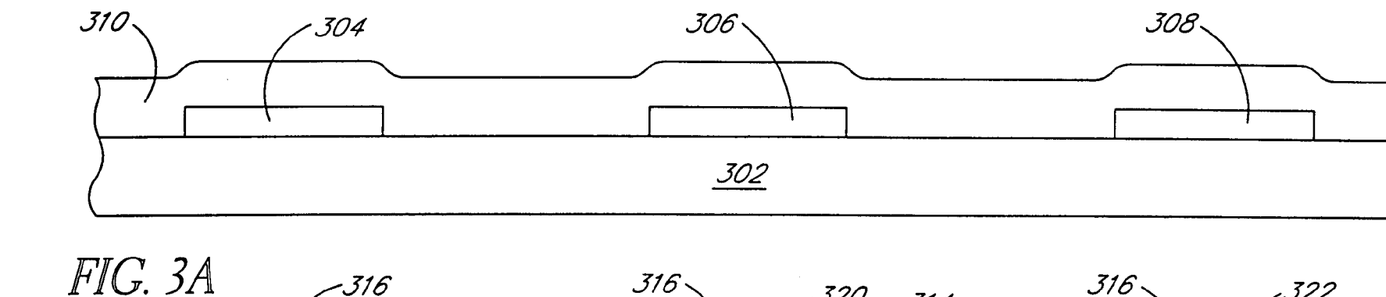
FIGS. 3A–3E are cross-sectional views illustrating an array of resistance variable material cells in various stages of construction.

FIG. 3A illustrates a portion of a substrate assembly with a substrate 302, a first lower electrode 304, a second lower electrode 306, and a third lower electrode 308. The substrate can correspond to a variety of substrates, such as an insulating substrate, a semiconductor substrate, or an insulating layer on a semiconductor substrate. Again, for the purposes of illustration, the memory cells will be described in the context of silver selenide as the metal-doped chalcogenide.

A layer of silver selenide 310 is formed above the substrate 302, the first lower electrode 304, the second lower electrode 306, and the third lower electrode 308. The layer of silver selenide 310 can be formed from stoichiometric silver selenide ($Ag_2Se$) or from slightly silver-rich or silver-poor silver selenide.

Figure 3B:
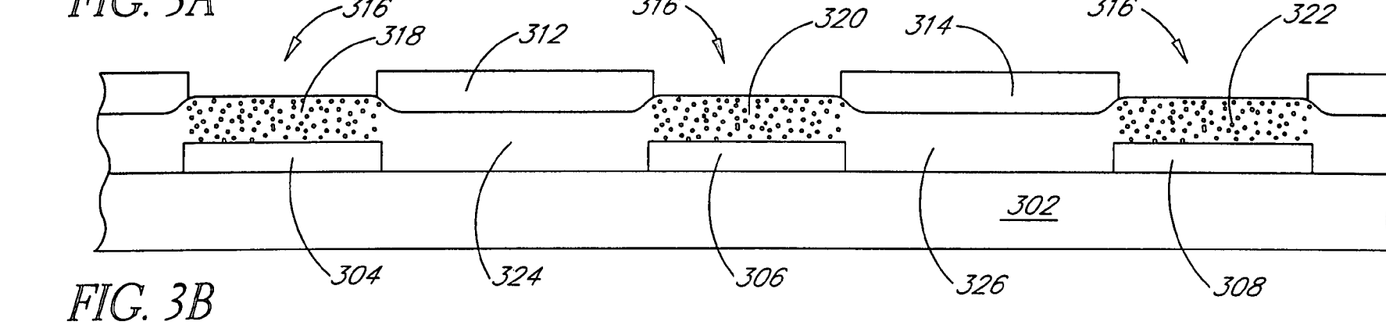

FIG. 3B illustrates the portion of the substrate assembly with a patterned mask. The patterned mask is formed on top of the layer of silver selenide 310 and is used to permit the selective implantation of oxygen. It will be understood that the layer of silver selenide 310 can be implanted with oxygen without a patterned mask. The illustrated patterned mask includes a first portion of photoresist 312 and a second portion of photoresist 314. In one embodiment, the patterned mask is formed from a layer of photoresist material that is patterned using photolithography. In another embodiment, the patterned mask is form from a hard mask, such as a mask of silicon nitride. Openings 316 are defined in the pattern mask to selectively provide access to the layer of silver selenide 310 such that oxygen can correspondingly be selectively implanted in the layer of silver selenide 310.

As illustrated in FIG. 3B, a first region 318, a second region 320, and a third region 322 are implanted with oxygen. The oxygen implanter tool can be configured to implant oxygen to a variety of depths. In one embodiment, the depth or range of implantation corresponds to approximately 100 (Å).

Figure 3C:
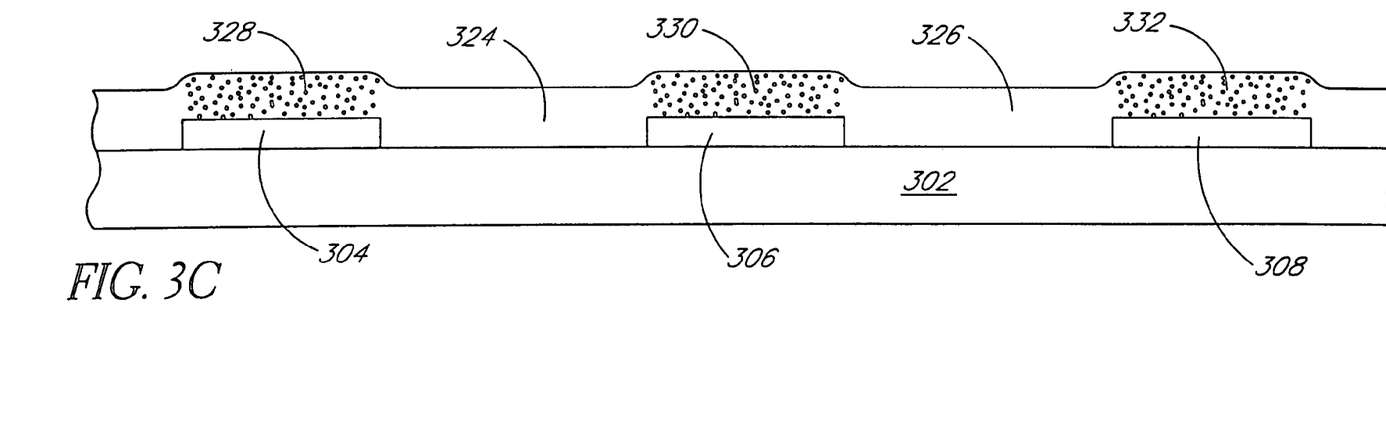

In FIG. 3C, the pattern mask is removed, and the substrate assembly is annealed. Annealing removes selenium oxide from the implanted regions of the layer of silver selenide illustrated by the first region 318, the second region 320 and the third region 322, thereby leaving silver-rich regions in the layer of silver selenide. These silver-rich regions are illustrated by a first silver rich-region 328, a second silver-rich region 330, and a third silver-rich region 332. As described earlier in connection with FIG. 1, patterning, implanting, and annealing of the silver selenide layer can be repeated multiple times to increase the amount of silver-richness in the silver selenide layer.

Figure 3D:
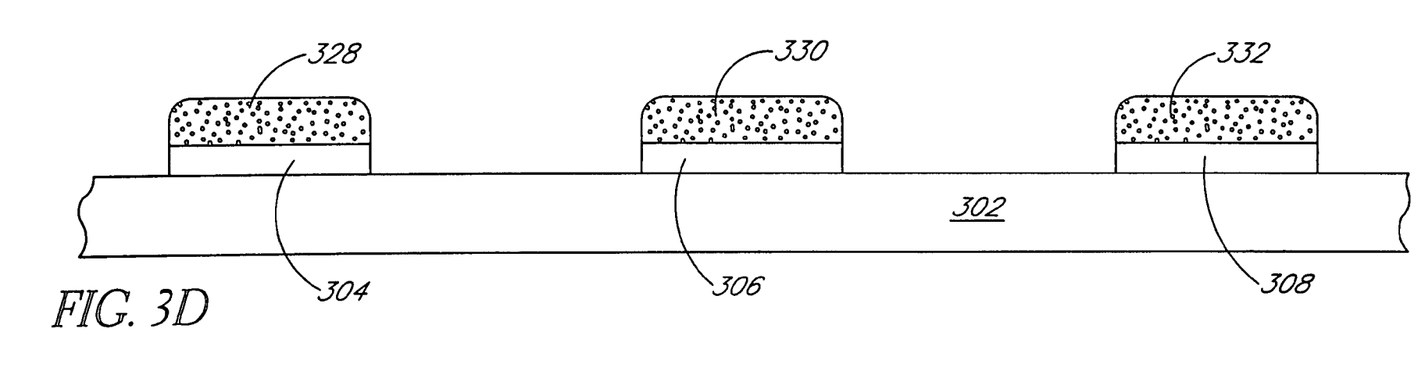

FIG. 3D illustrates the first silver-rich region 328, the second silver-rich region 330, and the third silver-rich region 332 that have been patterned into cells from the layer of silver selenide. A variety of techniques can be used to pattern cells including, for example, wet etching, reactive ion etching (RIE) and ion beam etching (IBE) techniques. It will be understood by one of ordinary skill in the art that such patterning techniques can also include additional mask patterning steps.

In addition, it will be understood that in-between patterning of cells and forming of upper electrodes, a layer of an insulator can be formed to fill the space between the cells. The layer of insulator can be made from a variety of materials, such as silicon nitride or polyimide. A chemical-mechanical polish (CMP) can smooth out the top of the layer of the insulator. A portion of the insulator can also be formed between the cell and the upper electrode, and the vias and plugs can be landed on the layer of silver-rich silver selenide to provide electrical continuity to the upper electrode.

Figure 3E:
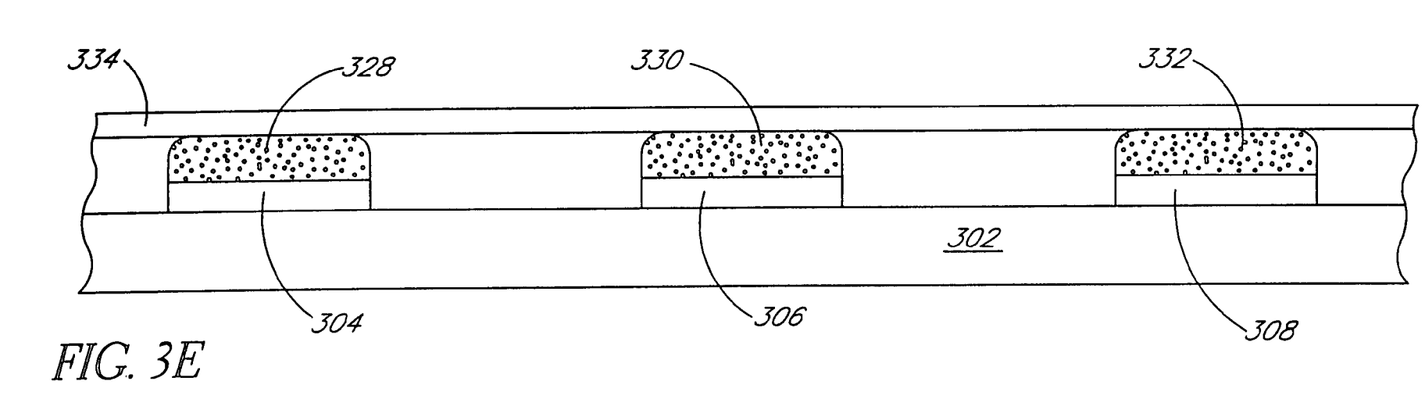

After patterning of the cells, upper electrodes are formed on top of the cells patterned from the silver rich-regions. For example, FIG. 3E illustrates an upper electrode 334 formed above cells patterned from the first silver-rich region 328, the second silver-rich region 330, and the third silver-rich region 332.

Figure 4:
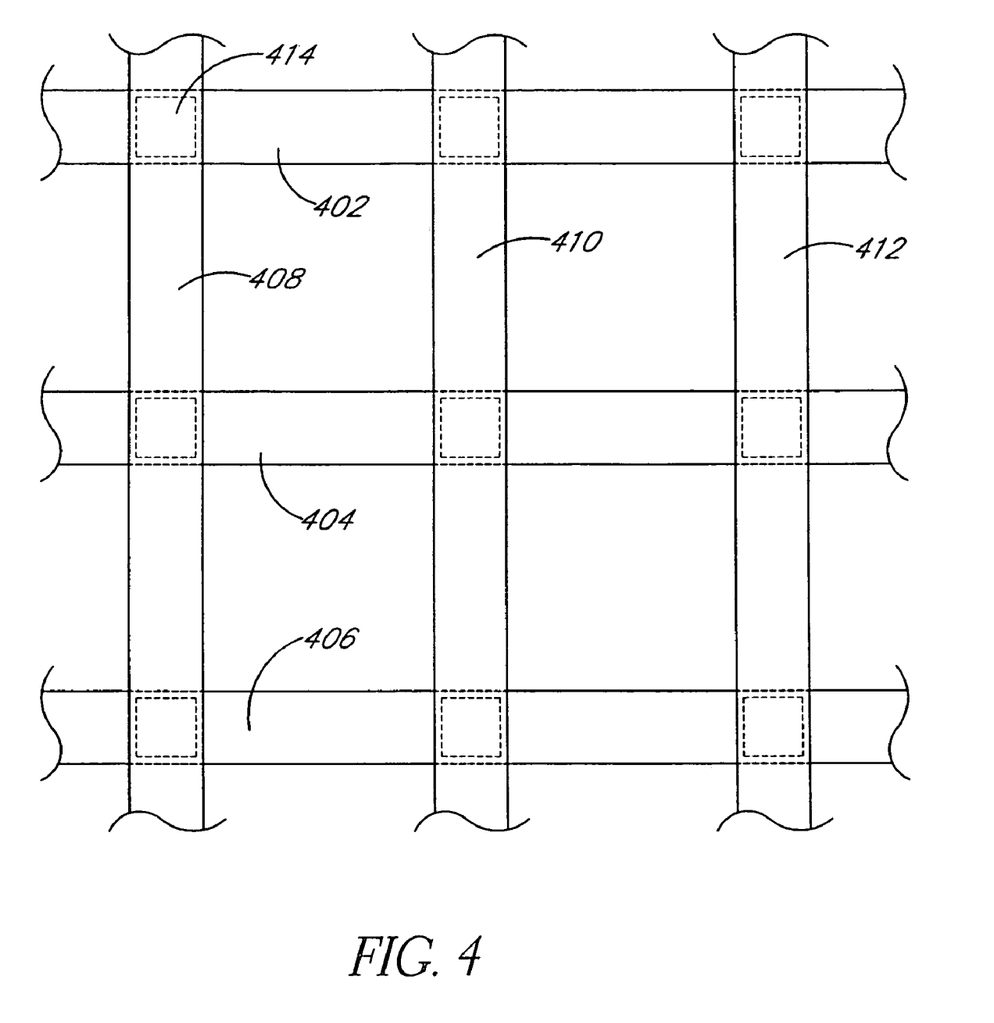
FIG. 4 is a schematic top-down view that illustrates an array of resistance variable material cells in a cross-point configuration.

FIG. 4 is a schematic top-down view that illustrates an array of resistance variable material cells in a cross-point configuration. It will be understood that a resistance variable material cell can also be isolated and coupled to transistors for read and write operations. The portion of the array shown in FIG. 4 includes 9 resistance variable material cells, but it will be understood by one of ordinary skill in the art that the number of cells in an array can vary in a very broad range. The array includes lower electrodes, as illustrated by a first lower electrode 402, a second lower electrode 404, and a third lower electrode 406. The array also includes upper electrodes, as illustrated by a first upper electrode 408, a second upper electrode 410, and a third upper electrode 412. In the illustrated cross-point configuration, the lower electrodes and the upper electrodes are arranged in an approximately orthogonal manner, but it will be understood that other configurations are possible.

Memory cells lie between the lower electrodes and the upper electrodes approximately where the electrodes cross. For example, a first resistance variable material cell 414 is disposed between the first lower electrode 402 and the first upper electrode 408. The contents of the first resistance variable material cell 414 can be accessed (for reading or writing) by activating the first lower electrode 402 and the first upper electrode 408. Information can be stored in a cell by forming or by disrupting conductive pathways, which varies the resistance of the cell. When an electric potential is applied between the upper electrode and the lower electrode, an electric field is generated in the layer of resistance variable material. In response to the electric field, a conductive pathway grows from the electrode configured as the cathode, i.e., the electrode with the more negative electric potential, to the electrode configured as the anode, i.e., the electrode with the more positive electric potential. Information can be read or retrieved from the cell by sensing the resistance of the cell.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

We claim:

1. A method of forming memory cells in a programmable conductor random access memory (PCRAM) comprising:
    (a) forming a plurality of electrodes;
    (b) forming a layer of chalcogenide glass;
    (c) forming a layer of silver selenide adjacent to the layer of chalcogenide glass;
    (d) forming a mask pattern over the layer of silver selenide;
    (e) implanting unmasked portions of the layer of silver selenide with oxygen;
    (f) removing the mask pattern;
    (g) annealing the layer of implanted silver selenide such that the layer is essentially free of selenium oxide thereby forming silver-rich regions of silver selenide; and
    (h) patterning to define cells, where patterning selectively removes unenriched regions of silver selenide.

2. The method as defined in claim 1, further comprising repeating (d) to (g) to further increase an amount of silver in the silver-rich regions of silver selenide.

3. The process as defined in claim 1, further comprising forming electrodes in a cross-point configuration.

4. The process as defined in claim 1, wherein the layer of chalcogenide glass is formed before forming the layer of silver selenide.

5. The process as defined in claim 1, wherein the layer of chalcogenide glass is formed after forming, implanting, annealing, and patterning the layer of silver selenide.

6. A process to increase a ratio of silver to a chalcogenide material in a composition of silver chalcogenide, comprising:
    providing silver chalcogenide; and
    removing a selected amount of chalcogenide from the silver chalcogenide by implanting oxygen into the silver chalcogenide and annealing the oxygen-implanted silver chalcogenide.

7. The process as defined in claim 6, further comprising repeating implanting and annealing for a predetermined number of times to further increase the ratio of silver to chalcogenide.

8. The process as defined in claim 6, wherein the silver chalcogenide is selected from the group consisting of silver selenide, silver telluride, and silver sulfide.

9. The process as defined in claim 6, wherein the silver chalcogenide is silver selenide.

* * * * *